(12) United States Patent
Warren

(10) Patent No.: US 8,243,536 B2
(45) Date of Patent: Aug. 14, 2012

(54) SYSTEMS AND METHODS FOR INCREASING BIT DENSITY IN A MEMORY CELL

(75) Inventor: Robert W. Warren, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 266 days.

(21) Appl. No.: 12/716,257

(22) Filed: Mar. 2, 2010

(65) Prior Publication Data

US 2011/0058415 A1  Mar. 10, 2011

Related U.S. Application Data

(60) Provisional application No. 61/240,471, filed on Sep. 8, 2009.

(51) Int. Cl.
*G11C 7/00* (2006.01)
(52) U.S. Cl. ............... 365/200; 365/185.11; 365/230.03
(58) Field of Classification Search .................. 365/200, 365/185.11, 230.03
See application file for complete search history.

(56) References Cited

U.S. PATENT DOCUMENTS

| | | | | |
|---|---|---|---|---|
| 6,067,248 A * | 5/2000 | Yoo | ........................ | 365/185.03 |
| 7,127,549 B2 | 10/2006 | Sinclair | | |
| 7,154,782 B2 * | 12/2006 | Lakhani et al. | .......... | 365/185.09 |
| 7,168,013 B2 * | 1/2007 | Roohparvar | .................. | 714/710 |
| 7,310,699 B2 | 12/2007 | Sinclair | | |
| 2005/0172067 A1 | 8/2005 | Sinclair | | |
| 2007/0028040 A1 | 2/2007 | Sinclair | | |
| 2009/0067303 A1 | 3/2009 | Poo et al. | | |
| 2009/0172280 A1 | 7/2009 | Trika et al. | | |

FOREIGN PATENT DOCUMENTS

KR  10/2009/0013394  2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren, et al.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,065, filed May 5, 2010, Warren, Robert.
U.S. Appl. No. 12/774,077, filed May 5, 2010, Warren, Robert.

* cited by examiner

*Primary Examiner* — Son Dinh
(74) *Attorney, Agent, or Firm* — Hamilton, DeSanctis & Cha

(57) ABSTRACT

Various embodiments of the present invention provide systems, methods and circuits for memory utilization. As one example, a memory system is disclosed that includes a memory bank and a memory access controller circuit. The memory bank includes a number of default memory cells and a number of redundant memory cells. The memory access controller circuit is operable to access a usable memory space including both the combined default memory cells and the redundant memory cells.

24 Claims, 7 Drawing Sheets

US 8,243,536 B2

SYSTEMS AND METHODS FOR INCREASING BIT DENSITY IN A MEMORY CELL

CROSS REFERENCE TO RELATED APPLICATIONS

The present application claims priority to (is a non-provisional of) U.S. Pat. App. No. 61/240,471, entitled "Systems and Methods for Utilizing Spare Flash Memory Cells to Increase Bit Density While Maintaining Lifecycle", and filed Sep. 8, 2009 by Warren. The entirety of the aforementioned provisional patent application is incorporated herein by reference for all purposes.

BACKGROUND OF THE INVENTION

The present inventions are related to systems and methods for memory utilization, and more particularly to systems and methods for utilizing a flash memory.

Flash memories have been used in a variety of devices where information stored by the device must be maintained even when power is lost to the device. A typical flash memory device exhibits a number of cells that can be charged to four distinct voltage levels representing two bits of data stored to the cell. By doing this, the memory density of a given flash device can be increased dramatically for the cost of a few additional comparators and a reasonable increase in write logic. Currently, there is a trend toward further increasing the number of bits that may be stored in any given cell by increasing the number of distinct voltage levels that may be programmed to the cell. For example, there is a trend toward increasing the number of distinct voltage levels to eight so that each cell can hold three data bits. While the process of increasing the number of bits stored to any given flash memory cell allows for increasing bit densities, it can result in a marked decline in the life cycle of the flash memory.

Hence, for at least the aforementioned reason, there exists a need in the art for advanced systems and methods for implementing memories.

BRIEF SUMMARY OF THE INVENTION

The present inventions are related to systems and methods for memory utilization, and more particularly to systems and methods for utilizing a flash memory.

Various embodiments of the present invention provide memory systems that include a memory bank and a memory access controller circuit. The memory bank includes a number of default memory cells and a number of redundant memory cells. The memory access controller circuit is operable to access a usable memory space including both the combined default memory cells and the redundant memory cells. In some instances of the aforementioned embodiments, the default memory cells and the redundant memory cells are flash memory cells, and each of the flash memory cells is capable of storing two or more bits per cell. In some cases the data written to the flash memory cells is written with a maximum number of bits per cell such that the bit density of the memory bank is increased and an expected lifecycle of the memory bank is decreased. In other cases the data written to the flash memory cells is written with a mid-level number of bits per cell such that the bit density of the memory bank is increased and an expected lifecycle of the memory bank is increased. In yet other cases, the data written to the flash memory cells is written with a mid-level number of bits per cell such that the bit density of the memory bank is increased and an expected lifecycle of the memory bank is decreased. In yet further cases, data written to the flash memory cells is written with a minimum number of bits per cell such that the bit density of the memory bank is decreased and an expected lifecycle of the memory bank is increased.

Other embodiments of the present invention provide methods for memory utilization that include providing a memory bank having a number of default memory cells and a number of redundant memory cells; and accessing a usable memory space that includes both the combined default memory cells and the redundant memory cells. In some cases, the default memory cells and the redundant memory cells are flash memory cells each capable of storing two or more bits per cell. In some such cases, the method further includes receiving a data set, and encoding the data set. In particular cases, the data set is encoded such that a maximum number of bits per flash memory cell are used. This results in a first bit density of the memory bank that is greater than a second bit density of the memory bank when the redundant memory cells are not included in the usable memory space, and a first expected lifecycle of the memory bank that is less than a second expected lifecycle of the memory bank when the redundant memory cells are not included in the usable memory space. In other particular cases, the data set is encoded such that a minimum number of bits per flash memory cell are used. This results in a first bit density of the memory bank that is less than a second bit density of the memory bank when the redundant memory cells are not included in the usable memory space, and a first expected lifecycle of the memory bank that is greater than a second expected lifecycle of the memory bank when the redundant memory cells are not included in the usable memory space. In yet other particular cases, the data set is encoded such that a mid-level number of bits per flash memory cell are used. This results in a first bit density of the memory bank that is greater than a second bit density of the memory bank when the redundant memory cells are not included in the usable memory space, and a first expected lifecycle of the memory bank that is greater than a second expected lifecycle of the memory bank when the redundant memory cells are not included in the usable memory space. In yet further particular cases, such mid-level decoding results in a first bit density of the memory bank that is less than a second bit density of the memory bank when the redundant memory cells are not included in the usable memory space, and a first expected lifecycle of the memory bank that is greater than a second expected lifecycle of the memory bank when the redundant memory cells are not included in the usable memory space.

Yet further embodiments of the present invention provide electronics systems that comprise a memory device that includes a memory bank including a number of default memory cells and a number of redundant memory cells, and a memory access controller circuit that is operable to access a memory space according to a memory map. The system further includes a processor and a computer readable medium. The computer readable medium includes instructions executable by the processor to define a memory map of the memory bank to include a usable memory space incorporating the default memory cells and the redundant memory cells. In various instances of the aforementioned embodiments, each of the default memory cells and a the redundant memory cells are capable of storing two or more bits per cell. In some such instances, the instructions are further executable by the processor to: receive a data set, and encode the data set such that a minimum number of bits per memory cell are used. In other such instances, the instructions are further executable by the processor to: receive a data set, and encode the data set such that a maximum number of bits per memory cell are used. In yet other instances of the aforementioned embodiments, each of the default memory cells and the redundant memory cells are capable of storing three or more bits per cell. In such instances, the instructions may further executable by the processor to: receive a data set, and encode the data set such that a mid-level number of bits per memory cell are used.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for memory utilization, and more particularly to systems and methods for utilizing a flash memory.

Some memory devices include a body of default memory cells that are generally accessible by a memory controller, and a number of redundant memory cells that may be used in place of one or more default memory cells that exhibit limited operation. As used herein, the phrase "redundant memory cell" is used in its broadest sense to mean any memory cell that is provided to be used as a replacement for a defective or degraded memory cell. As used herein, the phrase "default memory cells" is used in its broadest sense to mean any memory cell in a memory device that is not a redundant memory cell. As an example, the default memory cells may be flash memory cells that incrementally degrade each time data is written and/or read from the cells. Over time, the incremental degradation may result in an inability to reliably store and retrieve data from the cell. In such a case, one of the redundant cells may be used in place of the degraded cell that is retired. Such an approach seeks to increase the lifecycle of a memory device. However, such an approach results in a decrease in the number of bits per device that may be supported as a considerable area of a memory device die is dedicated to redundant cells.

Various embodiments of the present invention provide for utilizing redundant cells of a flash memory device as default memory cells (i.e., as additional memory space in the memory device). Without a change in the default number of bits that each of the cells is used to store, such an approach increases bit density of a flash memory while reducing the lifecycle of the device by using redundant cells in parallel with the default cells. In some embodiments of the present invention, encoding is applied to effectively reduce the number of bits per cells and increase the lifecycle to approximately the lifecycle expected when redundant cells were reserved for replacement of failing cells. In other embodiments of the present invention, encoding is applied to effectively reduce the number of bits per cells and increase the lifecycle to greater than that expected when redundant cells were reserved for replacement of failing cells.

Figure 1:
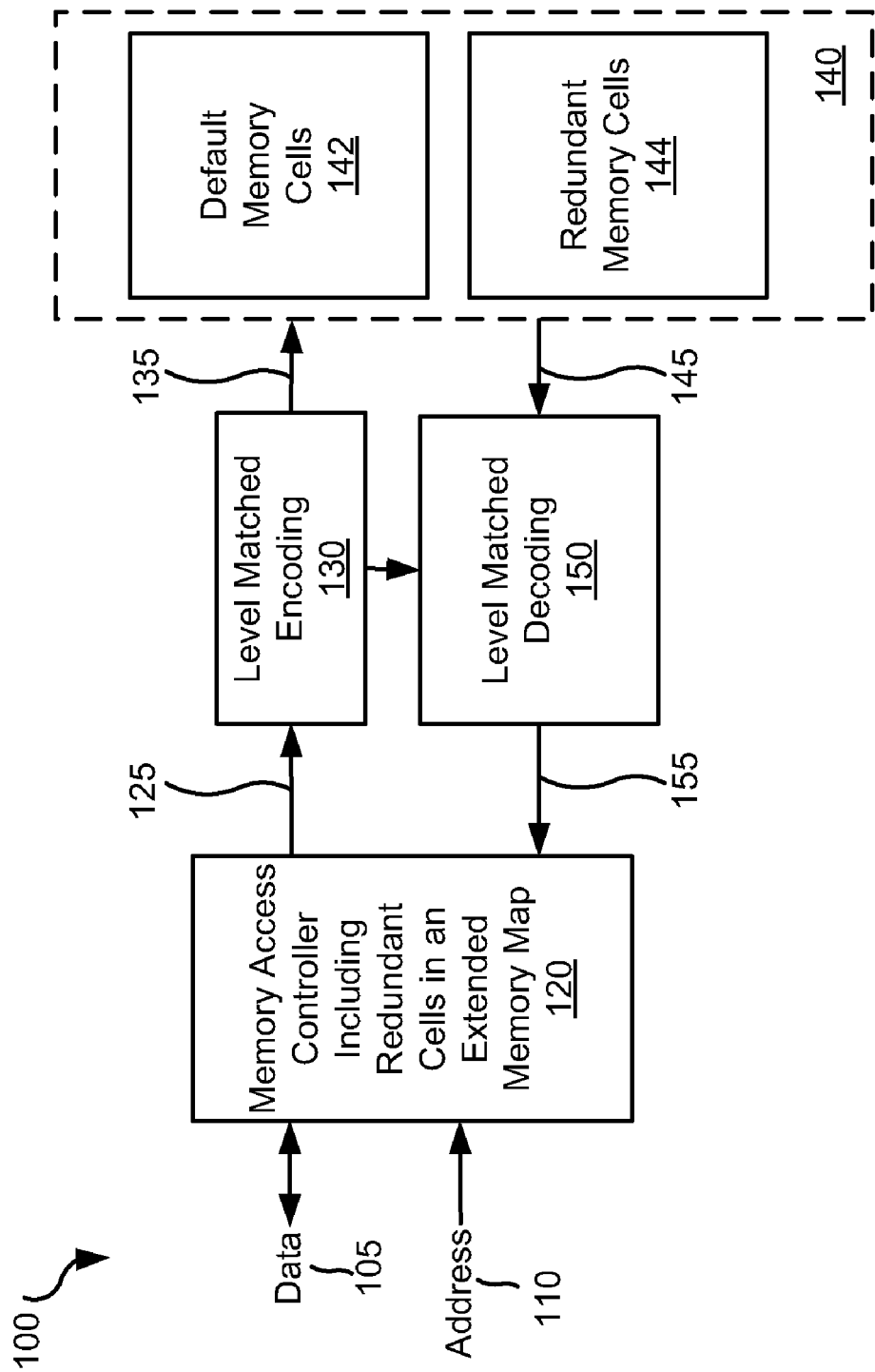
FIG. 1 depicts a flash memory system including a flash memory bank with both flash memory cells and redundant cells in accordance with various embodiments of the present invention.

Turning to FIG. 1, a memory system 100 including a memory bank 140 with both default memory cells 142 and redundant memory cells 144 is shown in accordance with various embodiments of the present invention. In some embodiments, memory bank 140 is a flash memory bank having default flash memory cells and redundant flash memory cells. Memory system 100 includes a memory access controller circuit 120. Memory access controller circuit 120 supports an extended memory map of memory bank 140 that includes redundant memory cells 144 in addition to default memory cells 142. Memory access controller circuit 120 receives an address input 110 that selects which location data will be read or written from, and a bidirectional data I/O 105 that receives data to be written and provides data that has been read. Memory access controller circuit 120 may either automatically determine the overall memory size (i.e., default memory cells 142 plus redundant memory cells 144), or may be externally programmed with the overall memory size. This overall memory size becomes the outline of the memory map that is governed by memory access controller circuit 120. In some embodiments where memory bank 140 is a flash memory bank, memory access controller circuit 120 includes an ability to disable any replacement algorithm that is employed by the flash memory bank to replace degenerated default memory cells with redundant memory cells. Other embodiments include preprogramming the flash memory bank to disable any replacement algorithm that is employed by flash memory bank to replace degenerated default memory cells with redundant memory cells.

In some embodiments, memory access controller circuit 120 determines what level of encoding is to be applied to the data when data is written, and what level of decoding is to be applied when data is read. For example, memory bank 140 may offer three level encoding (i.e., memory bank 140 has memory cells that are each capable of holding three different bits of data by differentiating between eight threshold levels to yield eight different three bit patterns—'000', '001', '010', '011', '100', '101', '110' and '111'). In this case, different data maintained in memory bank 140 may be encoded as one bit cells capable of holding only a single bit per cell, as two bit cells capable of holding two bits per cell, or as three bit cells capable of holding three bits per cell. It should be noted that other embodiments of the present invention may use a flash memory bank including cells having more or fewer levels of encoding.

The determination of whether to encode as one bit, two bit or three bit cells may be made based upon one or more different criteria. For example, where the data being written is read only data that will not be modified, it may be encoded as three bit cell data because the degradation to the cells over time will be limited due to the read only status of the data. As another example, where data is to be written that is expected to be modified frequently, it may be encoded as one bit cell data because the degradation to the cells will be relatively large due to the expected number of overwrites required as data is modified. As another example, data may be encoded as one or two bit cells where it is destined to be written to cells in memory bank 140 that is reporting an increased error rate suggesting degradation of the cells. For example, when cells are written with three bit encoding report a high error rate, the cells may be written with two bit encoding requiring differentiation of half of the previous voltage levels. Similarly, when cells are written with two bit encoding report a high error rate, the cells may be written with one bit encoding requiring differentiation of half of the previous voltage levels. As yet another example, determination of whether to encode as one bit, two bit or three bit cells may be hard wired such that memory access controller circuit 120 always writes and reads data as one bit encoded, two bit encoded, or three bit encoded data. Based upon the disclosure provided herein, one of ordinary skill in the art will recognize a variety of basis for determining what level of encoding is to be applied to a given data set.

An output 125 from memory access controller circuit 120 is provided to a level matched encoding circuit 130. Output 125 includes the data to be written as received via bidirectional data I/O 105 along with an indication of the level of encoding to be applied. Level matched encoding circuit 130 applies the determined level of encoding to the received data and provides an output 135 including the encoded data. Using the example where the cells of memory bank 140 are each capable of holding three bits of data, the following table identifies the threshold levels used when three bit encoding, two bit encoding or one bit encoding for a given cell of memory bank 140. The threshold to the right represents the value written to the cell, and the threshold to the left represents the value of the data bits in the cell.

| Three Bit Threshold Write Levels | Two Bit Threshold Write Levels | One Bit Threshold Write Levels |
| --- | --- | --- |
| '000' => '000' | '00' => '000' | '0' => '000' |
| '001' => '001' | | |
| '010' => '010' | '01' => '011' | |
| '011' => '011' | | |
| '100' => '100' | '10' => '101' | '1' => '111' |
| '101' => '101' | | |
| '110' => '110' | '11' => '111' | |
| '111' => '111' | | |

Thus, where a three bit encoding is determined, the data received as part of output 125 is provided as is to output 135. Where two bit encoding is determined, a '00' data input received as part of output 125 is converted to a '000' write to memory bank 140; a '01' data input received as part of output 125 is converted to a '011' write to memory bank 140; a '10' data input received as part of output 125 is converted to a '101' write to memory bank 140; and a '11' data input received as part of output 125 is converted to a '111' write to memory bank 140. Where one bit encoding is determined, a '0' data input received as part of output 125 is converted to a '000' write to memory bank 140; and a '1' data input received as part of output 125 is converted to a '111' write to memory bank 140. To demonstrate application of the above mentioned encoding, the following table identifies the encoding applied to respective data inputs for a six bit data input where three bit encoding, two bit encoding or one bit encoding is used for cells of memory bank 140:

| Data Input | Three Bit Encoded Output | Two Bit Encoded Output | One Bit Encoded Output |
| --- | --- | --- | --- |
| 0000XX | Output 135 is '000', '0XX' | Output 135 is '000', '000',... | Output 135 is '000', '000', '000', '000',... |
| 0001XX | Output 135 is '000', '1XX' | Output 135 is '000', '011',... | Output 135 is '000', '000', '000', '111',... |
| 0010XX | Output 135 is '001', '0XX' | Output 135 is '000', '101',... | Output 135 is '000', '000', '111', '000',... |
| 0011XX | Output 135 is '001', '1XX' | Output 135 is '000', '111',... | Output 135 is '000', '000', '111', '111',... |
| 0100XX | Output 135 is '010', '0XX' | Output 135 is '011', '000',... | Output 135 is '000', '111', '000', '000',... |
| 0101XX | Output 135 is '010', '1XX' | Output 135 is '011', '011',... | Output 135 is '000', '111', '000', '111',... |
| 0110XX | Output 135 is '011', '0XX' | Output 135 is '011', '101',... | Output 135 is '000', '111', '111', '000',... |
| 0111XX | Output 135 is '011', '1XX' | Output 135 is '011', '111',... | Output 135 is '000', '111', '111', '111',... |
| 1000XX | Output 135 is '100', '0XX' | Output 135 is '101', '000',... | Output 135 is '111', '000', '000', '000',... |
| 1001XX | Output 135 is '100', '1XX' | Output 135 is '101', '011',... | Output 135 is '111', '000', '000', '111',... |
| 1010XX | Output 135 is '101', '0XX' | Output 135 is '101', '101',... | Output 135 is '111', '000', '111', '000',... |
| 1011XX | Output 135 is '101', '1XX' | Output 135 is '101', '111',... | Output 135 is '000', '000', '111', '111',... |
| 1100XX | Output 135 is '110', '0XX' | Output 135 is '111', '000',... | Output 135 is '111', '111', '000', '000',... |
| 1101XX | Output 135 is '110', '1XX' | Output 135 is '111', '011',... | Output 135 is '111', '111', '000', '111',... |

| Data Input | Three Bit Encoded Output | Two Bit Encoded Output | One Bit Encoded Output |
|---|---|---|---|
| 1110XX | Output 135 is '111', '0XX' | Output 135 is '111', '101', . . . | Output 135 is '111', '111', '111', '000', . . . |
| 1111XX | Output 135 is '111', '1XX' | Output 135 is '111', '111', . . . | Output 135 is '111', '111', '111', '111', . . . |

A table of the encoding applied to each cell of memory bank 140 by level matched encoding circuit 130 may be maintained by a level matched decoding circuit 150. Level match decoding circuit 150 is operable to decode or undo the encoding that was applied by level matched encoding circuit 130. Alternatively, where the same encoding is always applied by level matched encoding circuit 130, then level match decoding circuit 150 may simply always apply the same decoding and the need for a table is eliminated. Using the example where the cells of memory bank 140 are each capable of holding three bits of data, the following table identifies the threshold levels used when three bit encoding, two bit encoding or one bit encoding for a given cell of memory bank 140 are used:

| Three Bit Threshold Read Levels | Two Bit Threshold Read Levels | One Bit Threshold Read Levels |
|---|---|---|
| '000' => '000' | '000' => '00' | '000' => '0' |
| '001' => '001' | '001' => '00' | '001' => '0' |
| '010' => '010' | '010' => '01' | '010' => '0' |
| '011' => '011' | '011' => '01' | '011' => '0' |
| '100' => '100' | '100' => '10' | '100' => '1' |
| '101' => '101' | '101' => '10' | '101' => '1' |
| '110' => '110' | '110' => '11' | '110' => '1' |
| '111' => '111' | '111' => '11' | '111' => '1' |

Thus, where a three bit encoding was used to write the particular cells being read back, the data received from memory bank 140 as an output 145 is provided as is as an output 155. Where two bit encoding was used to write the particular cells being read back, any of a '000' or '001' are converted to a '00' that is provided via output 155; any of a '010' or '011' are converted to a '01' that is provided via output 155; any of a '100' or '101' are converted to a '10' that is provided via output 155; and any of a '110' or '111' are converted to a '11' that is provided via output 155. Where one bit encoding is determined, any of a '000', '001', '010', or '011' are converted to a '0' that is provided via output 155; and any of a '100', '101', '110', or '111' are converted to a '1' that is provided via output 155. Output 155 is then provided by memory access controller circuit 120 via bidirectional data I/O 105.

It should be noted that other encodings may be used depending upon the particular implementation. For example, a three bit per cell device may be encoded as three bits per cell or one bit per cell. In such a case, where one bit encoding is applied a three bit value of '000' may correspond to a single bit '0', and all of three bit values '001', '010', '011', '100', '101', '110' and '111' may correspond to a single bit '1'. As another example, a three bit per cell device may be encoded as three bits per cell or two bits per cell. In such a case, where two bit encoding is applied a three bit value of '000' may correspond to a pattern '00', a three bit value of '001' or a '010' may correspond to a pattern '01', a three bit value of '011' or a '100' may correspond to a pattern '10', and a three bit value of '101', a '110' or a '111' may correspond to a pattern '11'. Based upon the disclosure provided herein, one of ordinary skill in the art will recognize a variety of encodings that may be applied to a given multi-bit memory cell.

Figure 2:
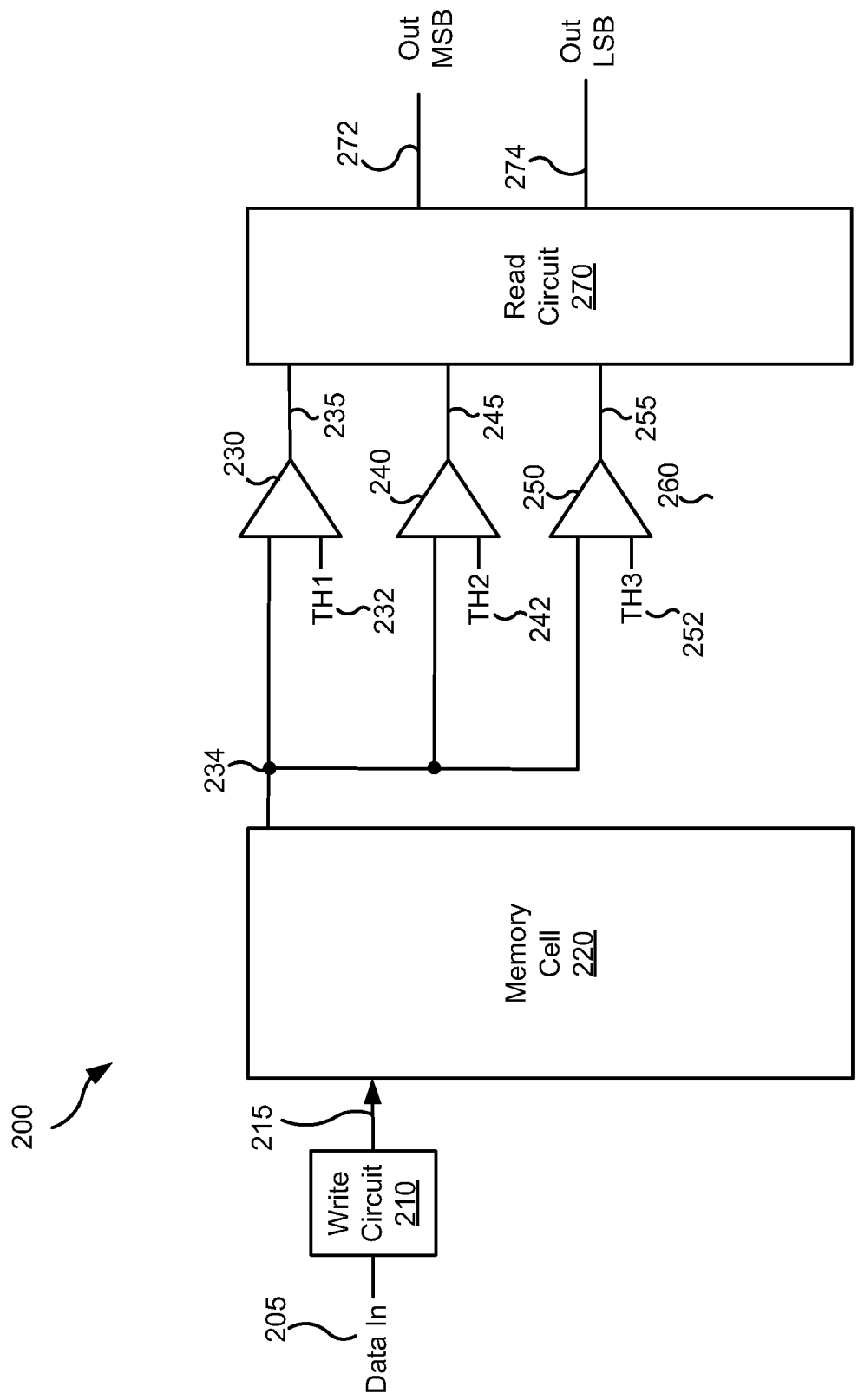
FIG. 2 shows a detailed implementation of a two bit flash memory cell that may be used in relation to the flash memory system of FIG. 1.

Turning to FIG. 2, a detailed implementation of a two bit flash memory cell 200 is shown that may be used in relation to the flash memory system of FIG. 1. Two bit flash memory cell 200 includes $2^n-1$ comparators (i.e., comparators 230, 240, 250) where 'n' is the number of bits per cell. Two bit flash memory cell 200 includes a write circuit 210 that receives a data input 205. Data input 205 is a two bit data input with possible values of '00', '01', '10' and '11'. Write circuit 210 buffers data input 205 and directs a voltage threshold 215 representing data input 205 to memory cell 220. Voltage threshold 215 has four discrete values corresponding to the four possible two bit values that can be stored in memory cell 220. For example, where data input 205 is a '00', voltage threshold 215 is a $V_L$; where data input 205 is a '11', voltage threshold 215 is a $V_H$, where data input 205 is a '10', voltage threshold 215 is a $V_H-V_S$; and where data input 205 is a '01', voltage threshold 215 is a $V_H-2V_S$. In an exemplary case, $V_H-2V_S$ is greater than $V_L$.

When memory cell 220 is to be read, an output voltage threshold 234 is provided in parallel to three comparators 230, 240, 250. Where memory cell 220 is not faulty, output voltage threshold 234 is approximately equal to voltage threshold 215. Where, on the other hand, memory cell 220 has been written and/or read a large number of times, damage resulting in significant leakage may result. In such a case, output voltage threshold 234 may be substantially less than voltage threshold 215. Comparator 230 compares output voltage threshold 234 with a threshold value 232; comparator 240 compares output voltage threshold 234 with a threshold value 242; and comparator 250 compares output voltage threshold 234 with a threshold value 252. The comparisons result in a thermometer output composed of comparator outputs 235, 245, 255. Using the example above, threshold value 232 may be $(V_L+V_H-2V_S)/2$ (i.e., the average of the two threshold values), threshold value 242 may be $(2V_H-3V_S)/2$ (i.e., the average of the two threshold values), and threshold value 252 may be $(2V_H-V_S)/2$ (i.e., the average of the two threshold values). Where output voltage threshold 234 is less than threshold value 232, comparator output 235 is a logic '0', comparator output 245 is a logic '0', and comparator output 255 is a logic '0' resulting in a thermometer output of '000'. This thermometer output is provided to a read circuit 270 that converts the thermometer output into a two bit output with a MSB 272 of a logic '0' and an LSB 274 of a logic '0'. Alternatively, where output voltage threshold 234 is greater than threshold value 232 and less than threshold value 242, comparator output 235 is a logic '1', comparator output 245 is a logic '0', and comparator output 255 is a logic '0' resulting in a thermometer output of '001'. This thermometer output is provided to a read circuit 270 that converts the thermometer output into a two bit output with a MSB 272 of a logic '0' and an LSB 274 of a logic '1'. Alternatively, where output voltage threshold 234 is greater than threshold value 242 and less than threshold value 252, comparator output 235 is a logic '1', comparator output 245 is a logic '1', and comparator output 255 is a logic '0' resulting in a thermometer output of '011'.

This thermometer output is provided to a read circuit 270 that converts the thermometer output into a two bit output with a MSB 272 of a logic '1' and an LSB 274 of a logic '0'. Finally, where output voltage threshold 234 is greater than threshold value 252, comparator output 235 is a logic '1', comparator output 245 is a logic '1', and comparator output 255 is a logic '1' resulting in a thermometer output of '111'. This thermometer output is provided to a read circuit 270 that converts the thermometer output into a two bit output with a MSB 272 of a logic '1' and an LSB 274 of a logic '1'.

It should be noted that two bit flash memory cell 200 can be scaled to larger numbers of bits per cell by increasing the number of comparators used to detect intermediate voltage levels, and by modifying write circuit 210 to make it capable of writing the increased number of thresholds. For example, a three bit memory cell may be created using the same memory cell along with seven comparators (i.e., $2^n-1$ comparators) and a write circuit capable of writing eight threshold values corresponding respectively to '000', '001', '010', '011', '100', '101', '110', and '111'. Similarly, cells capable of holding larger number of bits may be designed by increasing the number of comparators and writable threshold values. The encoding/decoding processes discussed above may be applied to any memory cell capable of holding two or more bits per cell.

Figure 3A:
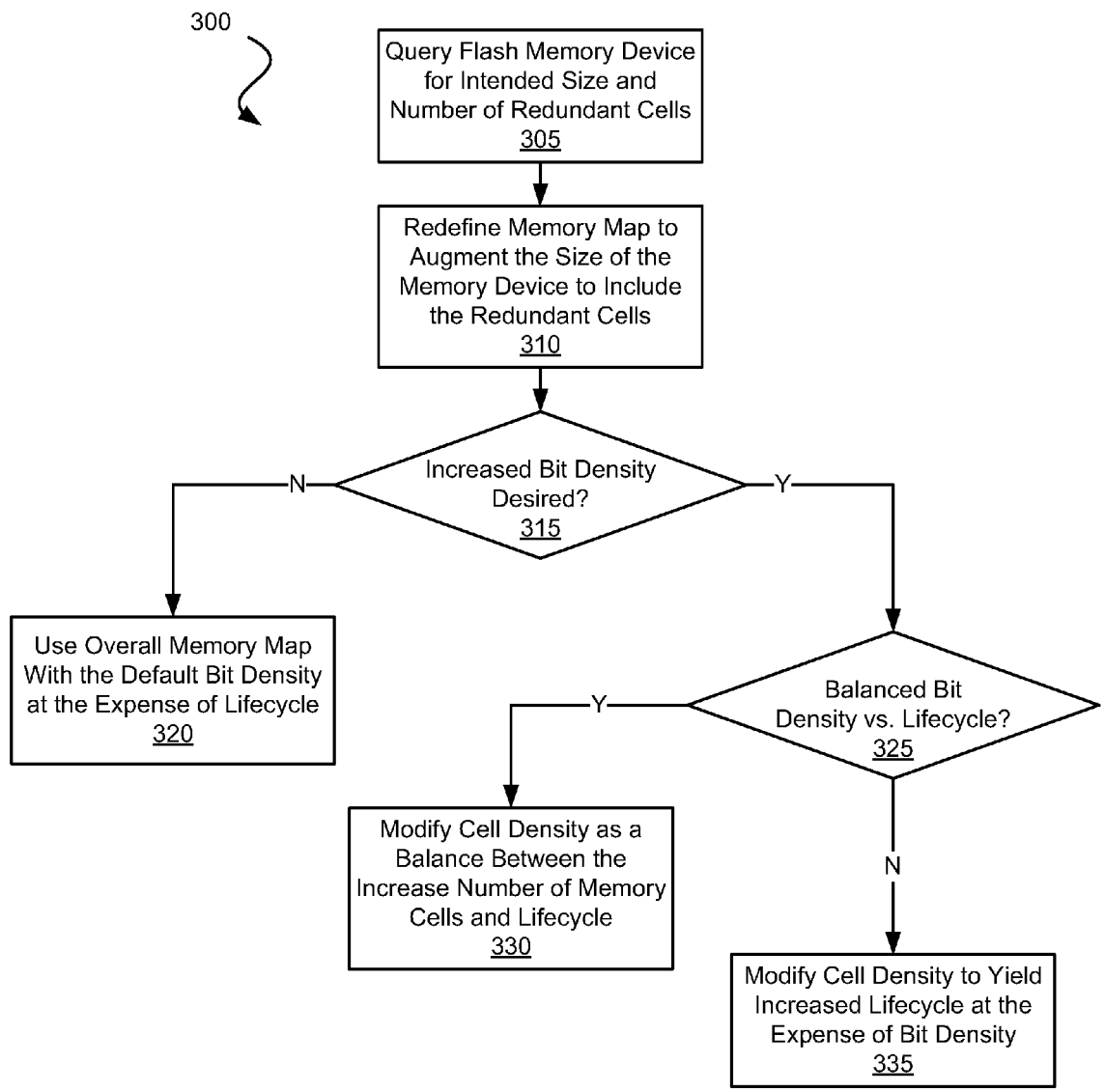
FIG. 3a is a flow diagram of a method in accordance with some embodiments of the present invention for balancing lifecycle and bit density.
Figure 3B:
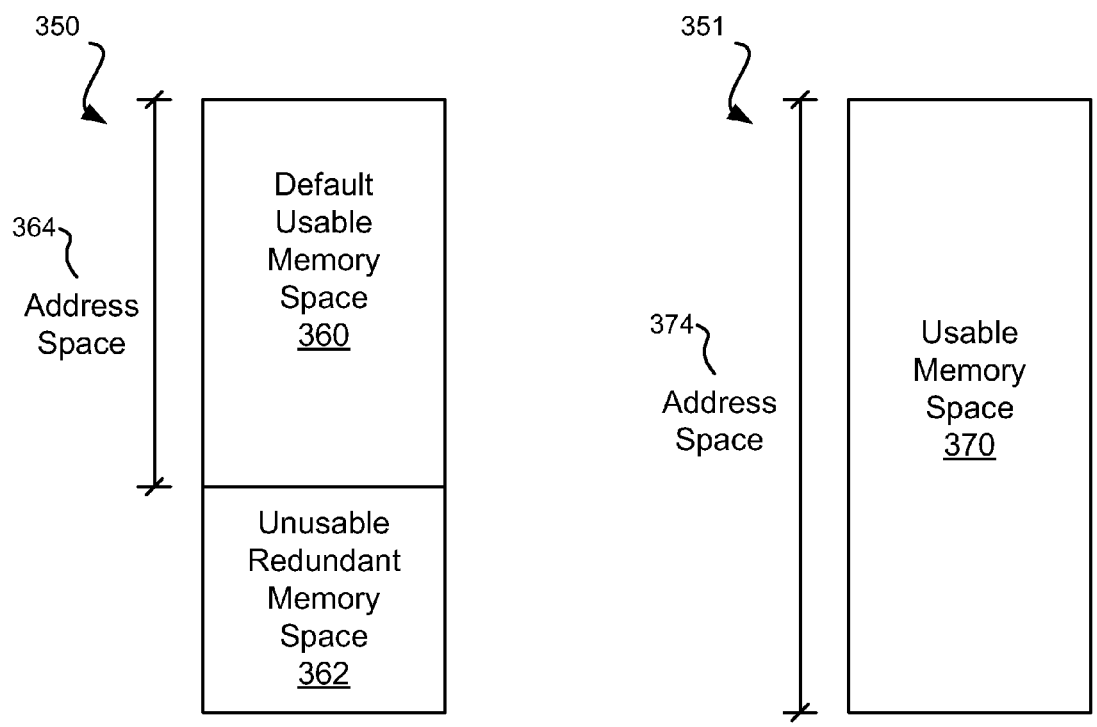
FIG. 3b shows a memory map prior to redefinition and the same memory map after redefinition in accordance with some embodiments of the present invention.

Turning to FIG. 3a, a flow diagram 300 depicts a method in accordance with some embodiments of the present invention for balancing lifecycle and bit density. Following flow diagram 300, a flash memory device is queried to determine both its intended size (i.e., the number of default memory cells) and the number of redundant cells that are included (block 305). In some cases this may be done by a memory access controller circuit accessing the flash memory device. In other cases, this may be done manually when pairing the flash memory device with the memory access controller circuit. Using this information, the memory map supported by memory access controller circuit is augmented to include the redundant memory cells in addition to the default memory cells (block 310). This may be done, for example, by a circuit included as part of the memory access controller circuit that automatically redefines the memory map. Alternatively, redefining the memory map may be done manually by hardwiring the size of the flash memory device paired with the memory access controller circuit. FIG. 3b shows a memory map 350 prior to redefinition and the same memory map 351 after redefinition. Memory map 350 includes an address space 364 that is limited to a usable memory space 360 and does not include an unusable redundant memory space 362. After redefinition, memory map 351 includes an address space 374 that includes all of the memory cells as part of a usable memory space 370.

Where it is determined that an increased bit density is desired at the expense of lifecycle (block 315), the overall memory map is used with the default number (i.e., the maximum) of bits per cell (block 320). Thus, for example, where each cell of the flash memory device can support three bits, encoding is applied that results in writing three bits per cell. In this case, the total available bit locations is increased in accordance with the following equation:

Total Bit Locations=(Number of Default Memory Cells*Maximum Bits Per Cell)+(Number of Redundant Memory Cells*Maximum Bits Per Cell).

This represents an increase in the number of available bit locations that comes at the expense of lifecycle as redundant cells are now no longer available to replace degraded default memory cells. The increase in the number of available bit locations is defined by the following equation:

ΔBit Locations=(Number of Redundant Memory Cells*Maximum Bits Per Cell).

Alternatively, where it is determined that an increased bit density is not desired at the expense of lifecycle (block 315), a balance between bit density and lifecycle may be directed (block 325). As used herein, the phrase "balance between bit density and lifecycle" is used in its broadest sense to mean that a mid-level encoding for a given bit is selected. Thus, for example, where memory cells support four bits per cell, a balance between bit density and lifecycle may include encoding as either two or three bits per cell. As another example, where the flash memory device offers three bits per cell, the mid-level encoding would be two bits per cell. Where a balance bit density and lifecycle is selected (block 325), then encoding is applied to decrease the number of bits per cell such that the lifecycle of each cell is increased (block 330). In this case, the total available bit locations is increased in accordance with the following equation:

Δ Bit Locations =

(Number of Default Memory Cells * Mid-Level Bits Per Cell) +

(Number of Redundant Memory Cells * Mid-Level Per Cell) −

(Number of Default Memory Cells * Maximum Bits per Cell).

This balanced approach is a compromise between the extremes of the maximum number of bit locations and shortest lifecycle, and the minimum number of bit locations and longest lifecycle. The balance between total bit location and lifecycle depends upon the number of redundant cells and the lifecycle increase achievable through encoding. The balance can be calculated in accordance with the following equation:

Δ Lifecycle =

(Lifecycle of Cell Using Mid-Level Bits Per Cell Encoding) −

(Lifecycle of Device Using Maximum Bits Per Cell

Augmented with Replacement with Redundant Cells).

Alternatively, where it is determined that a minimal bit density with an increased lifecycle is desired (block 325), encoding is applied to decrease the number of bits per cell to a minimal level such that the lifecycle of each cell is maximized (block 335). This includes encoding data for each cell with some minimum level encoding. Thus, for example, where the flash memory device offers three bits per cell, the applied encoding would be one bit per cell. In this case, the change in the number of bit locations available is increased in accordance with the following equation:

Δ Bit Locations =

(Number of Default Memory Cells * Minimuml Bits Per Cell) +

(Number of Redundant Memory Cells * Minumum Per Cell) −

(Number of Default Memory Cells * Maximum Bits per Cell).

This approach seeks to increase lifecycle at the expense of bit density in accordance with the following equation:

$$\Delta \text{ Lifecycle} =$$
(Lifecycle of Cell Using Minimum Bits Per Cell Encoding) −
(Lifecycle of Device Using Maximum Bits Per Cell
Augmented with Replacement with Redundant Cells).

Figure 4A:
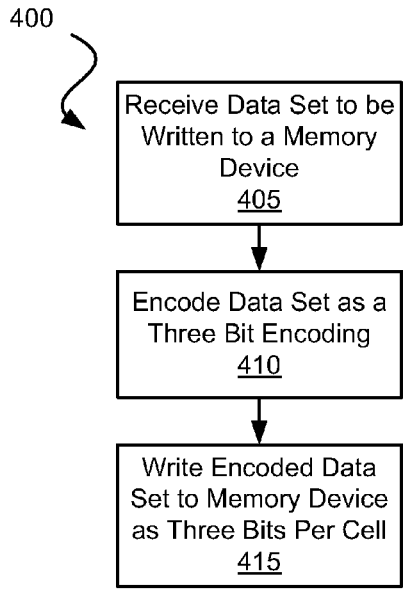
FIGS. 4a-4c are flow diagrams of a methods in accordance with some embodiments of the present invention for writing data to a three bit flash memory device depending upon a balance of lifecycle and bit density.

Turning to FIG. 4a, a flow diagram 400 depicts a process in accordance with some embodiments of the present invention for writing three bit encoded data to a memory device that supports three bits per cell. Flow diagram 400 may be used in place of block 320 of flow diagram 300 where a write is directed. Following flow diagram 400, a data set is received that is to be written to a memory device (block 405). The data set is a series of digital bits that may each exhibit either a logic '1' or a logic '0'. The size of the data set depends on the amount of data to be written to the memory device, and/or the size of any front end write buffering employed by the memory device. In some embodiments, the memory device is a flash memory device capable of storing three bits per memory cell through use of seven threshold comparators. In other embodiments, the memory device is another type of solid state memory capable of storing three bits per memory cell. Based upon the disclosure provided herein, one of ordinary skill in the art will recognize a variety of memory devices to which the different embodiments disclosed herein may be applied. In particular, it should be noted that a similar method may be applied to a memory device capable of storing two bits per memory cell through use of three threshold comparisons, or more than three bits per memory cell through use of $2^n - 1$ comparisons, where n is the number of bits per cell.

The received data is encoded using three bit encoding (block 410). Where the cells of the memory device are designed to hold three bits of data in each cell, such three bit encoding involves writing the received data as is in sets of three bits to respective cells. The following table identifies the threshold levels used for three bit encoding of data to be written to the memory cells:

| Three Bit Threshold Write Levels |
| --- |
| '000' => '000' |
| '001' => '001' |
| '010' => '010' |
| '011' => '011' |
| '100' => '100' |
| '101' => '101' |
| '110' => '110' |
| '111' => '111' |

Thus, where the memory device includes memory cells that are capable of holding three bits per cell, the data received is provided as is. To demonstrate application of the above mentioned encoding, the following table identifies the encoding applied to respective data inputs for a six bit data input where three bit encoding is applied:

| Data Input | Three Bit Encoded Output |
| --- | --- |
| XYXYXY | Output to Memory Device is 'XYX', 'YXY' |

Ultimately, the encoded data is written to respective cells of the memory device as three bits per cell (block 415).

Figure 4B:
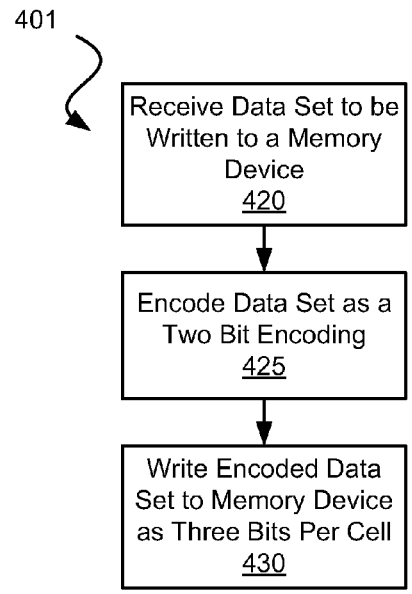

Turning to FIG. 4b, a flow diagram 401 depicts a process in accordance with some embodiments of the present invention for writing two bit encoded data to a memory device that supports three bits per cell. Flow diagram 401 may be used in place of block 330 of flow diagram 300 where a write is directed. Following flow diagram 401, a data set is received that is to be written to a memory device (block 420). As discussed above, the data set is a series of digital bits each exhibiting either a logic '1' or a logic '0'. The size of the data set depends on the amount of data to be written to the memory device, and/or the size of any front end write buffering employed by the memory device. In some embodiments, the memory device is a flash memory device capable of storing three bits per memory cell through use of seven threshold comparisons. In other embodiments, the memory device is another type of solid state memory capable of storing three bits per memory cell through use of seven threshold comparisons. Based upon the disclosure provided herein, one of ordinary skill in the art will recognize a variety of memory devices to which the different embodiments disclosed herein may be applied. In particular, it should be noted that a similar method may be applied to a memory device capable of storing two bits per memory cell through use of three threshold comparisons, or more than three bits per memory cell through use of $2^n - 1$ comparisons, where n is the number of bits per cell.

The received data is encoded using two bit encoding (block 425). Where the cells of the memory device are designed to hold three bits of data in each cell, such two bit encoding involves writing the received data in sets of two bits to each respective cell. The following table identifies the threshold levels used for two bit encoding of data to be written to the memory cells:

| Two Bit Threshold Write Levels |
| --- |
| '00' => '000' |
| '01' => '011' |
| '10' => '101' |
| '11' => '111' |

Thus, where a two bit encoding is used (block 310), a '00' data input received is converted to a '000' write to the memory device; a '01' data input is converted to a '011' write to the memory device; a '10' data input received is converted to a '101' write to the memory device; and a '11' data input received is converted to a '111' write to the memory device. To demonstrate application of the above mentioned encoding, the following table identifies the encoding applied to respective data inputs for a four bit data input where two bit encoding is applied:

| Data Input | Two Bit Encoded Output |
| --- | --- |
| 0000 | Output to Memory Device is '000', '000' |
| 0001 | Output to Memory Device is '000', '011'... |
| 0010 | Output to Memory Device is '000', '101'... |
| 0011 | Output to Memory Device is '000', '111'... |
| 0100 | Output to Memory Device is '011', '000'... |
| 0101 | Output to Memory Device is '011', '011'... |
| 0110 | Output to Memory Device is '011', '101'... |
| 0111 | Output to Memory Device is '011', '111'... |
| 1000 | Output to Memory Device is '101', '000'... |
| 1001 | Output to Memory Device is '101', '011'... |

-continued

| Data Input | Two Bit Encoded Output |
|---|---|
| 1010 | Output to Memory Device is '101', '101'... |
| 1011 | Output to Memory Device is '101', '111'... |
| 1100 | Output to Memory Device is '111', '000'... |
| 1101 | Output to Memory Device is '111', '011'... |
| 1110 | Output to Memory Device is '111', '101'... |
| 1111 | Output to Memory Device is '111', '111'... |

Ultimately, the encoded data is written to respective cells of the memory device as three bits per cell (block 430).

Figure 4C:
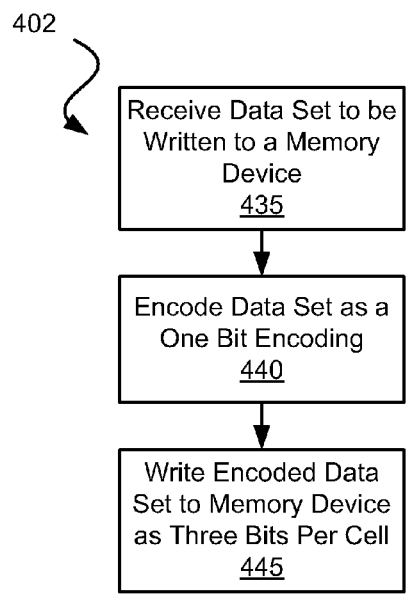

Turning to FIG. 4c, a flow diagram 402 depicts a process in accordance with some embodiments of the present invention for writing one bit encoded data to a memory device that supports three bits per cell. Flow diagram 402 may be used in place of block 335 of flow diagram 300 where a write is directed. Following flow diagram 402, a data set is received that is to be written to a memory device (block 435). As discussed above, the data set is a series of digital bits each exhibiting either a logic '1' or a logic '0'. The size of the data set depends on the amount of data to be written to the memory device, and/or the size of any front end write buffering employed by the memory device. In some embodiments, the memory device is a flash memory device capable of storing three bits per memory cell through use of seven threshold comparisons. In other embodiments, the memory device is another type of solid state memory capable of storing three bits per memory cell through use of seven threshold comparisons. Based upon the disclosure provided herein, one of ordinary skill in the art will recognize a variety of memory devices to which the different embodiments disclosed herein may be applied. In particular, it should be noted that a similar method may be applied to a memory device capable of storing two bits per memory cell through use of three threshold comparisons, or more than three bits per memory cell through use of $2^n-1$ comparisons, where n is the number of bits per cell.

The received data is encoded using one bit encoding (block 440). Where the cells of the memory device are designed to hold three bits of data in each cell, such one bit encoding involves writing the received data as is in sets of three bits to respective cells. The following table identifies the threshold levels used for one bit encoding of data to be written to the memory cells:

| One Bit Threshold Write Levels |
|---|
| '0' => '000' |
| '1' => '111' |

Thus, where one bit encoding is used a '0' data input received is converted to a '000' write to the memory device; and a '1' data input received is converted to a '111' write to the memory device. To demonstrate application of the above mentioned encoding, the following table identifies the encoding applied to respective data inputs for a four bit data input where one bit encoding is applied:

| Data Input | One Bit Encoded Output |
|---|---|
| 0000 | Output to Memory Device is '000', '000', '000', '000' |
| 0001 | Output to Memory Device is '000', '000', '000', '111' |
| 0010 | Output to Memory Device is '000', '000', '111', '000' |
| 0011 | Output to Memory Device is '000', '000', '111', '111' |

-continued

| Data Input | One Bit Encoded Output |
|---|---|
| 0100 | Output to Memory Device is '000', '111', '000', '000' |
| 0101 | Output to Memory Device is '000', '111', '000', '111' |
| 0110 | Output to Memory Device is '000', '111', '111', '000' |
| 0111 | Output to Memory Device is '000', '111', '111', '111' |
| 1000 | Output to Memory Device is '111', '000', '000', '000' |
| 1001 | Output to Memory Device is '111', '000', '000', '111' |
| 1010 | Output to Memory Device is '111', '000', '111', '000' |
| 1011 | Output to Memory Device is '111', '000', '111', '111' |
| 1100 | Output to Memory Device is '111', '111', '000', '000' |
| 1101 | Output to Memory Device is '111', '111', '000', '111' |
| 1110 | Output to Memory Device is '111', '111', '111', '000' |
| 1111 | Output to Memory Device is '111', '111', '111', '111' |

Ultimately, the encoded data is written to respective cells of the memory device as three bits per cell (block 445).

Figure 5A:
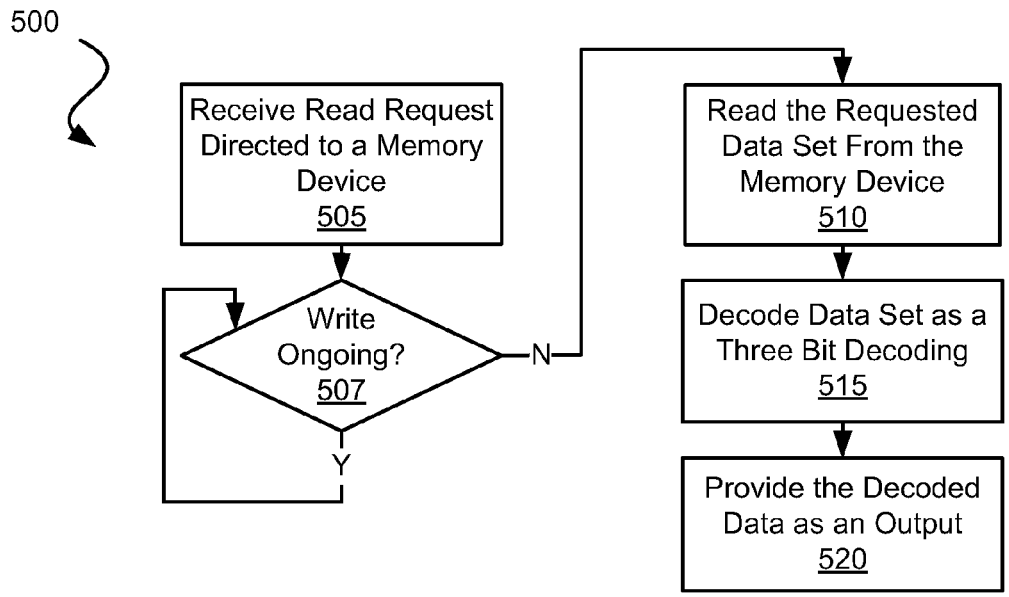
FIGS. 5a-5c are flow diagrams of a methods in accordance with some embodiments of the present invention for reading data from a three bit flash memory device depending upon a balance of lifecycle and bit density.

Turning to FIG. 5a, a flow diagram 500 depicts a method in accordance with some embodiments of the present invention for reading data from a three bit flash memory device where three bit encoding was applied to the originally written data. Flow diagram 500 may be used in place of block 320 of flow diagram 300 where a read is directed. Following flow diagram 500, a request to read data is received that is directed to a memory device (block 505). The request may include, for example, an address of data that is to be retrieved from the memory device. It is determined whether a write to the memory device is currently ongoing (block 507). Where a write is currently ongoing (block 507), completion of the write is awaited. If either a write was not ongoing or a previously ongoing write has completed (block 507), the requested data set is read from the memory device (block 510). The read data includes detecting a voltage threshold for each memory cell read and converting the magnitude of the voltage threshold into a three bit pattern. This process is repeated across a number of memory cells resulting in a series of three bit patterns.

The read data is then decoded using a three bit decoding (block 515). The three bit decoding is substantially the reverse of the three bit encoding discussed above. In this case, where the cells of the memory device are designed to hold three bits of data in each cell, such three bit decoding does not require any change to the received series of three bit patterns. The following table identifies the threshold levels used when three bit decoding is used to access the memory device:

| Three Bit Threshold Read Levels |
|---|
| '000' => '000' |
| '001' => '001' |
| '010' => '010' |
| '011' => '011' |
| '100' => '100' |
| '101' => '101' |
| '110' => '110' |
| '111' => '111' |

Thus, where a three bit encoding was used to write the particular cells being read back, each three bit pattern of the data received from the memory device is provided as is as a series of three bit patterns. Ultimately, the decoded data is provided as an output (block 520).

Figure 5B:
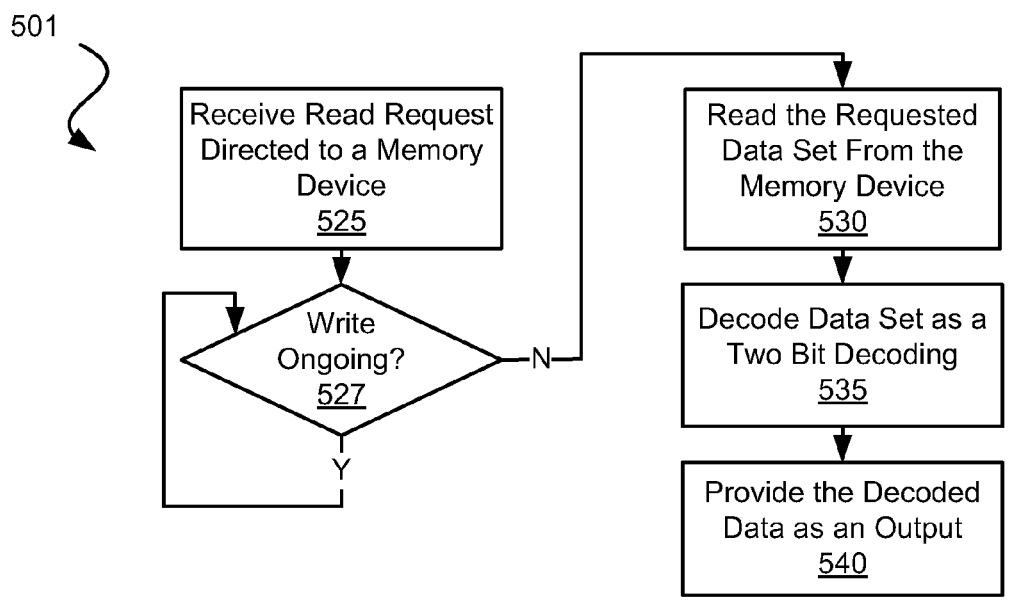

Turning to FIG. 5b, a flow diagram 501 depicts a method in accordance with some embodiments of the present invention for reading data from a three bit flash memory device where two bit encoding was applied to the originally written data. Flow diagram 501 may be used in place of block 330 of flow diagram 300 where a read is directed. Following flow diagram 501, a request to read data is received that is directed to a memory device (block 525). The request may include, for example, an address of data that is to be retrieved from the memory device. It is determined whether a write to the memory device is currently ongoing (block 527). Where a write is currently ongoing (block 527), completion of the write is awaited. If either a write was not ongoing or a previously ongoing write has completed (block 527), the requested data set is read from the memory device (block 530). The read data includes detecting a voltage threshold for each memory cell read and converting the magnitude of the voltage threshold into a three bit pattern. This process is repeated across a number of memory cells resulting in a series of three bit patterns.

The read data is then decoded using a two bit decoding (block 535). The two bit decoding is substantially the reverse of the two bit encoding discussed above. In this case, where the cells of the memory device are designed to hold three bits of data in each cell, the two bit decoding requires transformation of three bits of data into the corresponding two bits of data. The following table identifies the threshold levels used when two bit decoding is used to access the memory device:

| Two Bit Threshold Read Levels |
| --- |
| '000' => '00' |
| '001' => '00' |
| '010' => '01' |
| '011' => '01' |
| '100' => '10' |
| '101' => '10' |
| '110' => '11' |
| '111' => '11' |

Thus, where two bit encoding was used to write the particular cells being read back, any of a '000' or '001' are converted to a '00' that is provided as an output; any of a '010' or '011' are converted to a '01' that is provided as an output; any of a '100' or '101' are converted to a '10' that is provided as an output; and any of a '110' or '111' are converted to a '11' that is provided as an output. Ultimately, the decoded data is provided as an output (block 540).

Figure 5C:
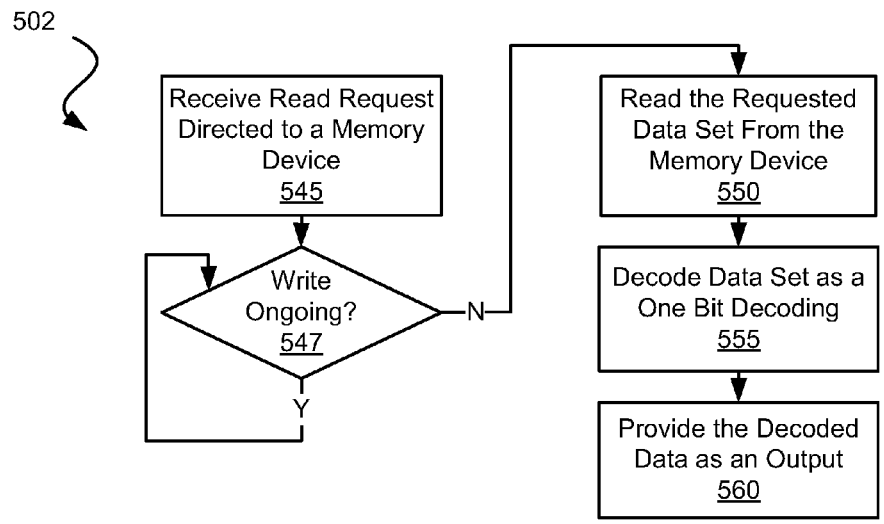

Turning to FIG. 5c, a flow diagram 502 depicts a method in accordance with some embodiments of the present invention for reading data from a three bit flash memory device where one bit encoding was applied to the originally written data. Flow diagram 502 may be used in place of block 335 of flow diagram 300 where a read is directed. Following flow diagram 501, a request to read data is received that is directed to a memory device (block 545). The request may include, for example, an address of data that is to be retrieved from the memory device. It is determined whether a write to the memory device is currently ongoing (block 547). Where a write is currently ongoing (block 547), completion of the write is awaited. If either a write was not ongoing or a previously ongoing write has completed (block 547), the requested data set is read from the memory device (block 550). The read data includes detecting a voltage threshold for each memory cell read and converting the magnitude of the voltage threshold into a three bit pattern. This process is repeated across a number of memory cells resulting in a series of three bit patterns.

The read data is then decoded using a one bit decoding (block 555). The one bit decoding is substantially the reverse of the one bit encoding discussed above. In this case, where the cells of the memory device are designed to hold three bits of data in each cell, the one bit decoding requires transformation of three bits of data into the corresponding single bits of data. The following table identifies the threshold levels used when one bit decoding is used to access the memory device:

| One Bit Threshold Read Levels |
| --- |
| '000' => '0' |
| '001' => '0' |
| '010' => '0' |
| '011' => '0' |
| '100' => '1' |
| '101' => '1' |
| '110' => '1' |
| '111' => '1' |

Thus, where one bit encoding was used to write the particular cells being read back, any of a '000', '001', '010', or '011' are converted to a '0' that is provided as an output; and any of a '100', '101', '110', or '111' are converted to a '1' that is provided as an output. Ultimately, the decoded data is provided as an output (block 560).

Again, while particular encodings are discussed in relation to FIGS. 3-4, it should be noted that other encodings may be used depending upon the particular implementation. For example, a three bit per cell device may be encoded as three bits per cell or one bit per cell. In such a case, where one bit encoding is applied a three bit value of '000' may correspond to a single bit '0', and all of three bit values '001', '010', '011', '100', '101', '110' and '111' may correspond to a single bit '1'. As another example, a three bit per cell device may be encoded as three bits per cell or two bits per cell. In such a case, where two bit encoding is applied a three bit value of '000' may correspond to a pattern '00', a three bit value of '001' or a '010' may correspond to a pattern '01', a three bit value of '011' or a '100' may correspond to a pattern '10', and a three bit value of '101', a '110' or a '111' may correspond to a pattern '11'. Based upon the disclosure provided herein, one of ordinary skill in the art will recognize a variety of encodings that may be applied to a given multi-bit memory cell.

Figure 6:
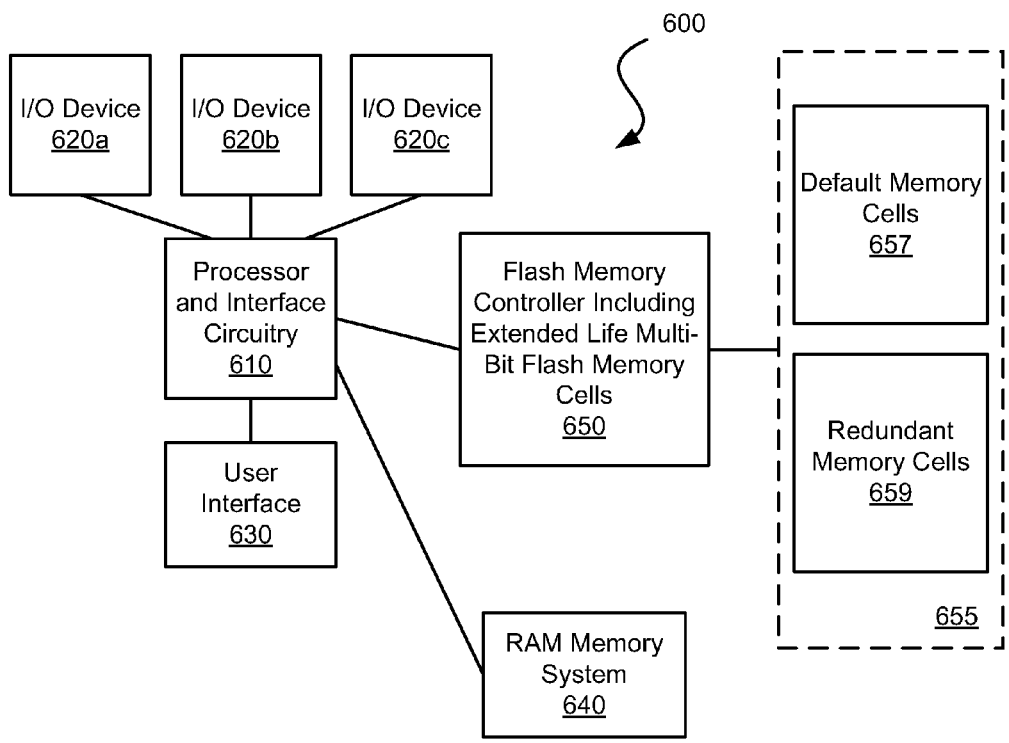
FIG. 6 shows an electronic system including a flash memory system with both flash memory cells and redundant cells in accordance with one or more embodiments of the present invention.

Turning to FIG. 6, an electronic system 600 including a flash memory system 655 with both default memory cells 657 and redundant cells 659 is shown in accordance with one or more embodiments of the present invention. In addition to flash memory system 655, electronic system 600 includes a processor with interface circuitry 610 that is communicably coupled to one or more I/O devices 620 and a user interface 630. In addition, processor 610 is communicably coupled to a non-flash random access memory 640. In one particular implementation, electronic system 600 is a personal computer where I/O devices 620 may include, but are not limited to, a keyboard, a mouse, a touch screen or the like. In such a case, user interface 630 may be a display. Random access memory 640 may hold a variety of instructions that are executable by processor 610 to cause particular actions to take place.

In one embodiment of the present invention, random access memory 640 includes instructions executable by processor 610 to set the overall size of flash memory system 655 to include both default memory cells 657 and redundant memory cells 659, and to select the level of encoding to be applied to data written to flash memory system 655. The instructions may cause the processor to read hardwired settings that indicate the size of flash memory system 655, or that cause processor 610 to access flash memory system 655 for information to aid in making the size determination. The level of encoding may similarly be selected through hardwired settings read by the processor, or may be user selectable via one or more of I/O devices 620 upon system initialization.

Flash memory system 655 may be implemented to include the ability to encode data stored in the memory such that fewer thresholds must be distinguished. As such, the memory density may be reduced in exchange for increasing the lifecycle of the memory or a portion thereof. In some cases, flash memory system 655 may be replaced by memory system 100 discussed above in relation to FIG. 1, and may include a number of memory cells similar to that discussed above in relation to FIG. 2. Of note, flash memory system 655 may be implemented using memory devices that are operable to hold two or more bits per cell, with the encoding/decoding process being used to tradeoff between the number of bits per cell and the life expectancy of the device or region of the device. In some cases, accesses to flash memory system 655 may be done consistent with the approaches discussed above in relation to FIGS. 3 through 5.

In conclusion, the invention provides novel systems, devices, methods and arrangements for utilizing memory. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for memory utilization, the method comprising:
providing a memory bank that includes a number of default memory cells and a number of redundant memory cells;
selecting a first encoding level for a first cell of the default memory cells and selecting a second encoding level for a second cell of the default memory cells, wherein the first encoding level is different from the second encoding level; and
accessing a usable memory space that includes both the combined default memory cells and the redundant memory cells, wherein the first cell is accessed in accordance with the first encoding level and the second cell is accessed in accordance with the second encoding level.

2. The method of claim 1, wherein the default memory cells and the redundant memory cells are flash memory cells each capable of storing two or more bits per cell.

3. The method of claim 2, wherein the method further comprises:
receiving a data set; and
encoding the data set such that a maximum number of bits per flash memory cell are used, wherein a first bit density of the memory bank is greater than a second bit density of the memory bank when the redundant memory cells are not included in the usable memory space, and wherein a first expected lifecycle of the memory bank is less than a second expected lifecycle of the memory bank when the redundant memory cells are not included in the usable memory space.

4. The method of claim 2, wherein the method further comprises:
receiving a data set; and
encoding the data set such that a minimum number of bits per flash memory cell are used, wherein a first bit density of the memory bank is less than a second bit density of the memory bank when the redundant memory cells are not included in the usable memory space, and wherein a first expected lifecycle of the memory bank is greater than a second expected lifecycle of the memory bank when the redundant memory cells are not included in the usable memory space.

5. The method of claim 2, wherein the method further comprises:
receiving a data set; and
encoding the data set such that a mid-level number of bits per flash memory cell are used, wherein a first bit density of the memory bank is greater than a second bit density of the memory bank when the redundant memory cells are not included in the usable memory space, and wherein a first expected lifecycle of the memory bank is greater than a second expected lifecycle of the memory bank when the redundant memory cells are not included in the usable memory space.

6. The method of claim 2, wherein the method further comprises:
receiving a data set; and
encoding the data set such that a mid-level number of bits per flash memory cell are used, wherein a first bit density of the memory bank is less than a second bit density of the memory bank when the redundant memory cells are not included in the usable memory space, and wherein a first expected lifecycle of the memory bank is greater than a second expected lifecycle of the memory bank when the redundant memory cells are not included in the usable memory space.

7. An electronics system, the system comprising:
a memory device, wherein the memory device includes:
a memory bank including a number of default memory cells and a number of redundant memory cells; and
a memory access controller circuit, wherein the memory access controller circuit is operable to access a memory space according to a memory map;
a processor; and
a computer readable medium including instructions executable by the processor to:
define a memory map of the memory bank to include a usable memory space incorporating the default memory cells and the redundant memory cells.

8. The system of claim 7, wherein each of the default memory cells and a the redundant memory cells are capable of storing two or more bits per cell, and wherein the instructions are further executable by the processor to:
receive a data set; and
encode the data set such that a minimum number of bits per memory cell are used.

9. The system of claim 7, wherein each of the default memory cells and the redundant memory cells are capable of storing three or more bits per cell, and wherein the instructions are further executable by the processor to:
receive a data set; and
encode the data set such that a mid-level number of bits per memory cell are used.

10. The system of claim 7, wherein each of the default memory cells and the redundant memory cells are capable of storing two or more bits per cell, and wherein the instructions are further executable by the processor to:
receive a data set; and
encode the data set such that a maximum number of bits per memory cell are used.

11. A memory system, the memory system comprising:
a memory bank including a number of default memory cells and a number of redundant memory cells; and
a memory access controller circuit operable to:
access a usable memory space, wherein the usable memory space includes at least a portion of both the default memory cells and the redundant memory cells;

select a first encoding level for a first cell of the default memory cells and select a second encoding level for a second cell of the default memory cells, wherein the first encoding level is different from the second encoding level.

12. The memory system of claim 11, wherein the memory access controller circuit is further operable to:
    select a third encoding level for a third cell of the redundant memory cells, wherein the third encoding level is selected from a group consisting of: a maximum number of bits per cell, and a minimum number of bits per cell.

13. The memory system of claim 11, wherein the memory access controller circuit is further operable to:
    select a third encoding level for a third cell of the redundant memory cells, wherein the third encoding level is selected from a group consisting of: a maximum number of bits per cell, a mid-level number of bits per cell, and a minimum number of bits per cell.

14. The memory system of claim 11, wherein the default memory cells and the redundant memory cells are flash memory cells.

15. The memory system of claim 11, wherein the first encoding level allows for writing the first cell with a maximum number of bits per cell, and wherein the second encoding level allows for writing the second cell with less than the maximum number of bits per cell.

16. The memory system of claim 11, wherein the first encoding level allows for writing the first cell with three bits per cell, and wherein the second encoding level allows for writing the second cell with less than three bits per cell.

17. The memory system of claim 11, wherein selecting the first encoding level for the first cell is based at least in part on a data type to be written to the first cell.

18. The memory system of claim 17, wherein the data type is selected from a group consisting of: read only, and modifiable.

19. The memory system of claim 11, wherein selecting the first encoding level for the first cell is based at least in part on an error rate associated with the first cell.

20. The memory system of claim 11, wherein selecting the first encoding level for the first cell is based at least in part on a control signal external to the memory access controller circuit.

21. The memory system of claim 11, wherein the memory system further comprises:
    a processor and a computer readable medium, wherein the computer readable medium includes instructions executable by the processor to: define a memory map of the memory bank to include a usable memory space incorporating the default memory cells and the redundant memory cells.

22. The memory system of claim 21, wherein the computer readable medium further includes instructions executable by the processor to:
    receive a data set; and
    encode the data set to comply with at least one of the first encoding level and the second encoding level.

23. The memory system of claim 22, wherein the first encoding level is selected from a group consisting of: a maximum number of bits per cell, a minimum number of bits per cell, and a mid-level number of bits per cell.

24. The method of claim 1, wherein the method further comprises:
    selecting a tird encoding level for a third cell of the redundant memory cells,
    wherein the third cell is accessed in accordance with the third encoding level.

* * * * *